United States Patent
Shen et al.

(10) Patent No.: US 11,351,622 B2
(45) Date of Patent: Jun. 7, 2022

(54) LASER SOLDERING SYSTEM

(71) Applicants: Tyco Electronics (Shanghai) Co. Ltd., Shanghai (CN); Tyco Electronics Corporation, Berwyn, PA (US); Tyco Electronics (Dongguan) Ltd, Guangdong (CN)

(72) Inventors: Hongzhou Shen, Shanghai (CN); Dandan Zhang, Shanghai (CN); Roberto Francisco-Yi Lu, Bellevue, WA (US); George J. Dubniczki, Mechanicsburg, PA (US); Qinglong Zeng, Guangdong (CN)

(73) Assignees: TE Connectivity Corporation, Berwyn, PA (US); Tyco Electronics (Shanghai) Co. Ltd., Shanghai (CN); Tyco Electronics (Dongguan) Co. Ltd, Dongguan (CN)

(*) Notice: Subject to any disclaimer, the term of this patent is extended or adjusted under 35 U.S.C. 154(b) by 586 days.

(21) Appl. No.: 15/234,091

(22) Filed: Aug. 11, 2016

(65) Prior Publication Data
US 2016/0346858 A1    Dec. 1, 2016

Related U.S. Application Data

(63) Continuation of application No. PCT/IB2015/050813, filed on Feb. 3, 2015.

(30) Foreign Application Priority Data

Feb. 13, 2014    (CN) .......................... 2014100511350

(51) Int. Cl.
*B23K 1/005* (2006.01)
*B23K 26/08* (2014.01)
(Continued)

(52) U.S. Cl.
CPC ............ *B23K 1/0056* (2013.01); *B23K 3/087* (2013.01); *B23K 20/004* (2013.01);
(Continued)

(58) Field of Classification Search
CPC B23K 1/0056; B23K 20/004; B23K 2101/32; B23K 2101/42; B23K 26/009;
(Continued)

(56) References Cited

U.S. PATENT DOCUMENTS 3,632,973 A * 1/1972 O'Keefe ................ B23K 3/047
219/230
4,727,471 A * 2/1988 Driels .................... B25J 9/1692
348/94

(Continued)

FOREIGN PATENT DOCUMENTS

JP    08148256 A    6/1996

OTHER PUBLICATIONS

PCT Search Report and Written Opinion, dated Jun. 16, 2015, 9 pages.
Abstract of JPH08148256, dated Jun. 7, 1996, 2 pages.

*Primary Examiner* — Tu B Hoang
*Assistant Examiner* — Vy T Nguyen
(74) *Attorney, Agent, or Firm* — Barley Snyder

(57) ABSTRACT

A laser soldering system is disclosed. The laser soldering system has a moving system, a gripper mounted on the moving system, a presser mounted on the moving system and having a transparent member, and a laser. The gripper grips an object and places the object at a target location on a product to be soldered. The transparent member presses the object against the product. The laser emits a laser beam through the transparent member to solder the object to the target location while the object is pressed against the product.

23 Claims, 4 Drawing Sheets

(51) Int. Cl.
    *B23K 20/00*          (2006.01)
    *B23K 26/00*          (2014.01)
    *H05K 3/34*           (2006.01)
    *B23K 3/08*           (2006.01)
    *B23K 101/32*        (2006.01)
    *B23K 101/42*        (2006.01)

(52) U.S. Cl.
    CPC ........ *B23K 26/009* (2013.01); *B23K 26/0884* (2013.01); *H05K 3/3494* (2013.01); *B23K 2101/32* (2018.08); *B23K 2101/42* (2018.08); *H01L 2224/78* (2013.01); *H05K 3/3421* (2013.01); *H05K 3/3489* (2013.01); *H05K 2201/10287* (2013.01); *H05K 2203/107* (2013.01)

(58) Field of Classification Search
    CPC . B23K 26/0884; B23K 3/087; H01L 2224/78; H05K 2201/10287; H05K 2203/107; H05K 3/3421; H05K 3/3489; H05K 3/3494
    USPC .......... 219/121.63, 121.85; 29/840; 156/382, 156/497; 228/219, 220, 42; 364/513, 364/559, 560, 514
    See application file for complete search history.

(56) References Cited

U.S. PATENT DOCUMENTS

| | | | |
|---|---|---|---|
| 4,778,097 A * | 10/1988 | Hauser | B23K 20/106 228/1.1 |
| 4,893,742 A * | 1/1990 | Bullock | B23K 20/10 228/111.5 |
| 4,906,812 A * | 3/1990 | Nied | B23K 1/0056 219/121.63 |
| 5,021,630 A | 6/1991 | Benko et al. | |
| 5,122,635 A | 6/1992 | Knodler et al. | |
| 5,227,604 A * | 7/1993 | Freedman | B23K 1/0056 219/121.63 |
| 5,250,781 A * | 10/1993 | Kanda | B23K 1/0056 156/382 |
| 5,525,777 A * | 6/1996 | Kukuljan | B23K 1/0056 219/121.83 |
| 5,653,381 A * | 8/1997 | Azdasht | B23K 1/0056 228/14 |
| 5,904,868 A * | 5/1999 | Economikos | H05K 13/0486 219/121.63 |
| 6,713,714 B1 * | 3/2004 | Azdasht | H05K 13/0409 219/121.64 |
| 6,773,169 B2 * | 8/2004 | Ebeling | G02B 6/4212 385/52 |
| 2001/0054637 A1 * | 12/2001 | Hayakawa | B23K 1/0056 228/102 |
| 2002/0128539 A1 * | 9/2002 | Higuma | A61B 1/121 600/133 |
| 2005/0051521 A1 * | 3/2005 | Shindo | H05K 3/3478 219/121.64 |
| 2005/0201666 A1 * | 9/2005 | Terada | G02B 6/4202 385/14 |
| 2006/0248960 A1 * | 11/2006 | Liskow | G01B 7/12 73/856 |
| 2008/0268571 A1 * | 10/2008 | Kim | B23K 1/0056 438/108 |
| 2009/0001054 A1 * | 1/2009 | Mizuno | B23K 1/0056 219/78.13 |
| 2009/0071945 A1 * | 3/2009 | Terada | B23K 26/0665 219/121.63 |
| 2011/0259857 A1 * | 10/2011 | Johnson | B23K 26/037 219/121.63 |
| 2014/0027418 A1 * | 1/2014 | Azdasht | B23K 26/02 219/121.66 |

\* cited by examiner

LASER SOLDERING SYSTEM

CROSS-REFERENCE TO RELATED APPLICATIONS

This application is a continuation of PCT International Application No. PCT/IB2015/050813, filed Feb. 3, 2015, which claims priority under 35 U.S.C. § 119 to Chinese Patent Application No. 201410051135.0, filed Feb. 13, 2014.

FIELD OF THE INVENTION

The present invention relates to a soldering system for automatically soldering a product, and more particularly, to a laser soldering system for automatically soldering a circuit board.

BACKGROUND

Soldering a complicated product with high precision is very difficult. Most commonly, a soldering worker uses a magnifying glass in order to solder wires onto hundreds of tiny pins or pads on a circuit board. Even with the assistance of the magnifying glass, the soldering worker can require several days to solder a complicated circuit board, and furthermore, cannot complete the soldering with the highest level of precision.

Laser soldering systems known in the prior art grip the wire to be soldered with a finger-type gripper. However, during soldering, the finger-type gripper can only grip and hold both sides of the wire, and cannot press the wire downward directly from the top of the wire. The wire consequently cannot be tightly and reliably pressed on a pad of the circuit board by the finger-type gripper, which may lead to an improperly formed solder joint, decreasing the soldering quality of the product.

SUMMARY

An object of the invention, among others, is to provide a laser soldering system capable of increasing soldering efficiency while effectively preventing improperly formed solder joints from occurring on a product. The disclosed laser soldering system has a moving system, a gripper mounted on the moving system, a presser mounted on the moving system and having a transparent member, and a laser. The gripper grips an object and places the object at a target location on a product to be soldered. The transparent member presses the object against the product. The laser emits a laser beam through the transparent member to solder the object to the target location while the object is pressed against the product.

BRIEF DESCRIPTION OF THE DRAWINGS

The invention will now be described by way of example with reference to the accompanying figures, of which.

DETAILED DESCRIPTION OF THE EMBODIMENT(S)

The invention is explained in greater detail below with reference to embodiments of a laser soldering system. This invention may, however, be embodied in many different forms and should not be construed as limited to the embodiments set forth herein; rather, these embodiments are provided so that this disclosure will be thorough and complete and still fully convey the scope of the invention to those skilled in the art.

A laser soldering system according to the invention is shown in FIGS. 1-4. The laser soldering system includes a vision system (not shown), a moving system 10, a laser 20, a gripper 200, a presser 100, and a controller (not shown). The major components of the invention will now be described in greater detail.

The vision system (not shown) may be a camera, or may be any other type of imaging device known to those with ordinary skill in the art.

Figure 1:
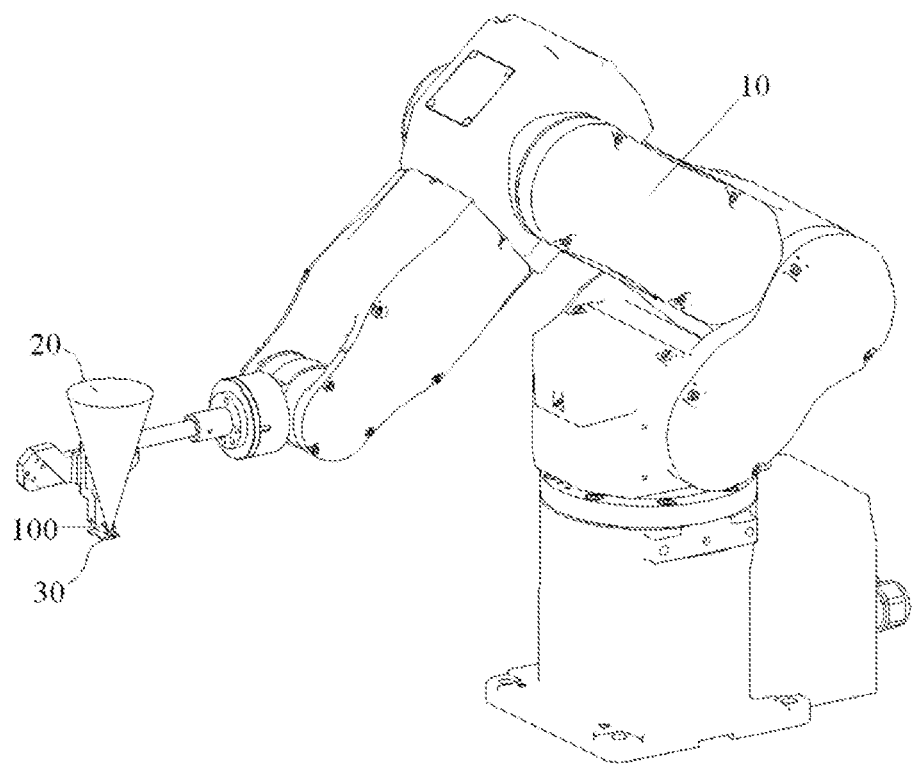
FIG. 1 is a perspective view of a laser soldering system according to the invention.
Figure 2:
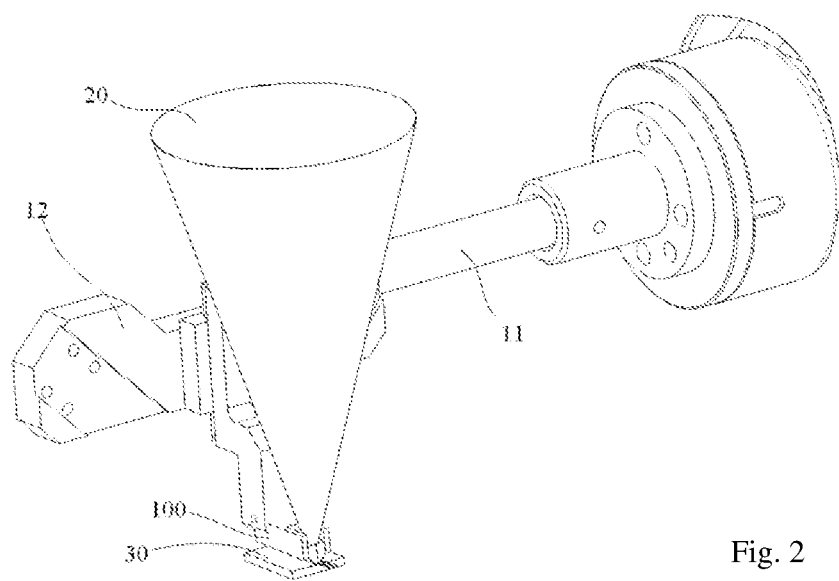
FIG. 2 is an enlarged view of the laser soldering system of FIG. 1.

The moving system 10, as shown in FIGS. 1 and 2, may be a multi-degree of freedom robot arm, for example, a 6-degree of freedom robot arm. As shown in FIG. 2, the moving system 10 has an arm 11 positioned at an end, with an installation plate 12 fixed on an end of the arm 11.

Figure 3:
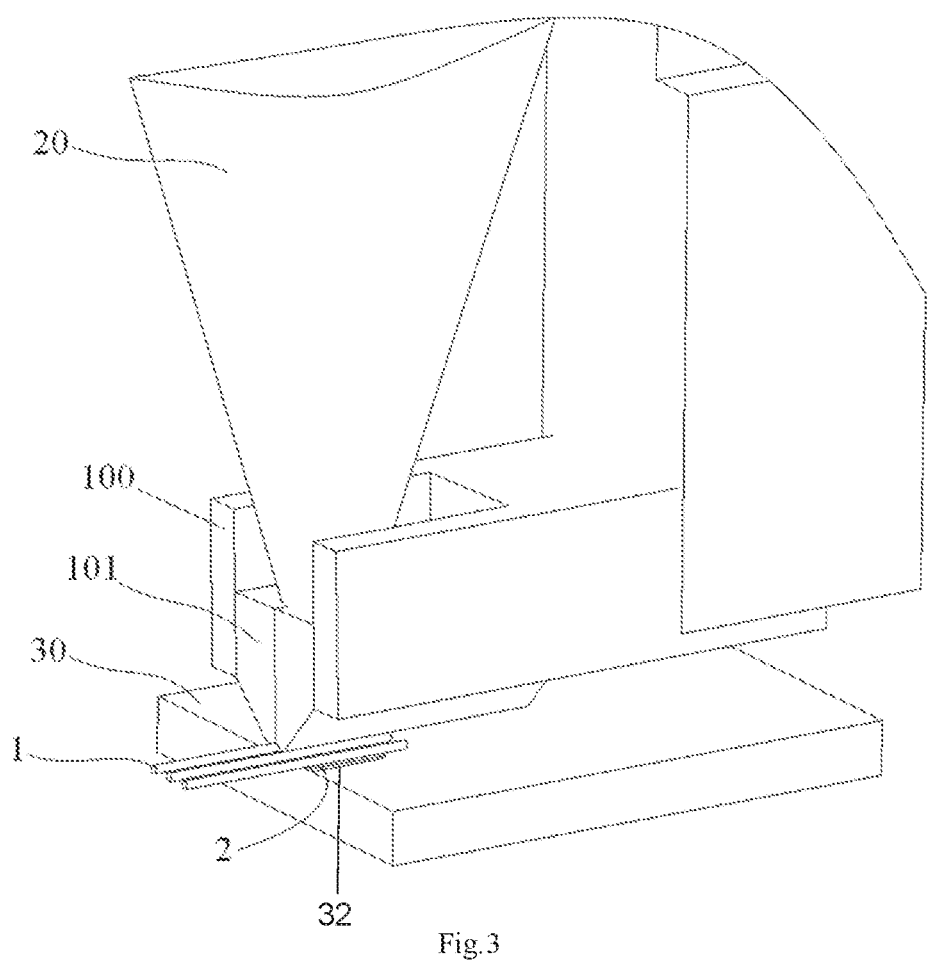
FIG. 3 is an enlarged view of a presser of the laser soldering system of FIG. 1.

The laser 20, shown in FIGS. 1-3, may be any form of laser 20 known to those with ordinary skill in the art.

Figure 4:
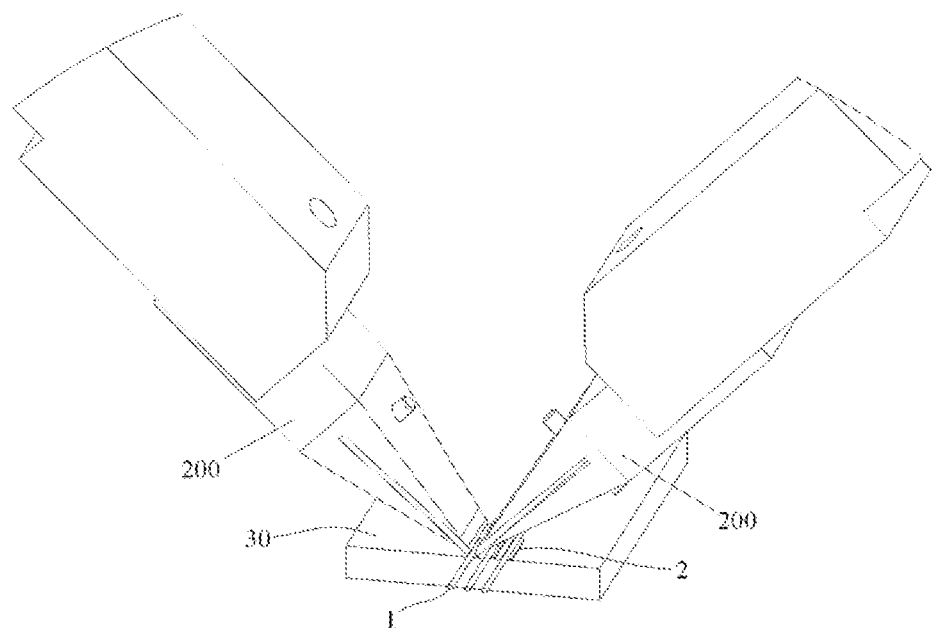
FIG. 4 is an enlarged view of a gripper of the laser soldering system of FIG. 1.

The gripper 200, as shown in FIG. 4, may be a finger-type gripper, or may be any other type of gripper 200 known to those with ordinary skill in the art.

The presser 100, shown in FIGS. 1-3, is formed in a substantially rectangular shape and has a transparent member 101. As shown in FIG. 3, the transparent member 101 protrudes from the presser 100, and has an arc recess surface at an end opposite the presser 100. In an embodiment, the transparent member 101 is formed of an elastic material.

The controller (not shown) has a processor, a non-transitory computer readable medium, and a program stored on the non-transitory computer readable medium executable by the processor.

The assembly of the laser soldering system will now be described in greater detail. As shown in FIGS. 1-4, the presser 100, the gripper 200, and the laser 20 are mounted on the moving system 10. The gripper 200 and the presser 100 are both removably mounted on the installation plate 12. The laser 20 is positioned over the presser 100, an end of the laser 20 aligning with the transparent member 101, as shown particularly in FIGS. 1-3.

The use of the laser soldering system will now be described in greater detail with reference to FIGS. 1-4. The laser soldering system is described as used with an object 1 and a product 30 to be soldered having a target location 2 on the product 30. In the embodiment shown in FIGS. 1-4, the object 1 is a plurality of wires, the product 30 is a circuit board, and the target location 2 is a pad on the circuit board.

The processor executes the program, and the controller automatically controls the motion of the moving system 10 along with the operation of the presser 100, gripper 200, and laser 20 according to instructions contained within the program. The controller may receive input from the vision system in controlling the laser soldering system. The laser soldering system automatically performs the below soldering operation under the control of the program executed by the processor of the controller.

The gripper 200 grips the object 1 and places the object 1 accurately on the target location 2 under the guidance of the vision system, as shown in FIG. 4. The gripper 200 places the object 1 such that a center line of the object 1 is aligned with a center line of the target location 2. In an embodiment, the object 1 is pre-arranged on the target location 2, manually or by a machine, before being gripped and accurately positioned by the gripper 200.

The presser 100 presses the accurately positioned object 1, as shown in FIG. 3, to hold the position of the object 1 onto the target location 2 of the product 30. The arc recess surface of the transparent member 101 directly presses on a top surface of the object 1. In an embodiment, the transparent member 101 is elastic, which can protect the object 1 from damage and more reliably hold the object 1 on the target location 2.

A laser beam emitted from the laser 20 transmits through the transparent member 101 to heat soldering flux 32, so as to solder the object 1 onto the respective target location 2. The soldering flux 32, as shown in FIG. 3, may be a conductive paste pre-printed on the product 30, an alloy solder pre-melted or fused on the product 30, or a welding wire applied to product 30 during soldering.

Figure 5:
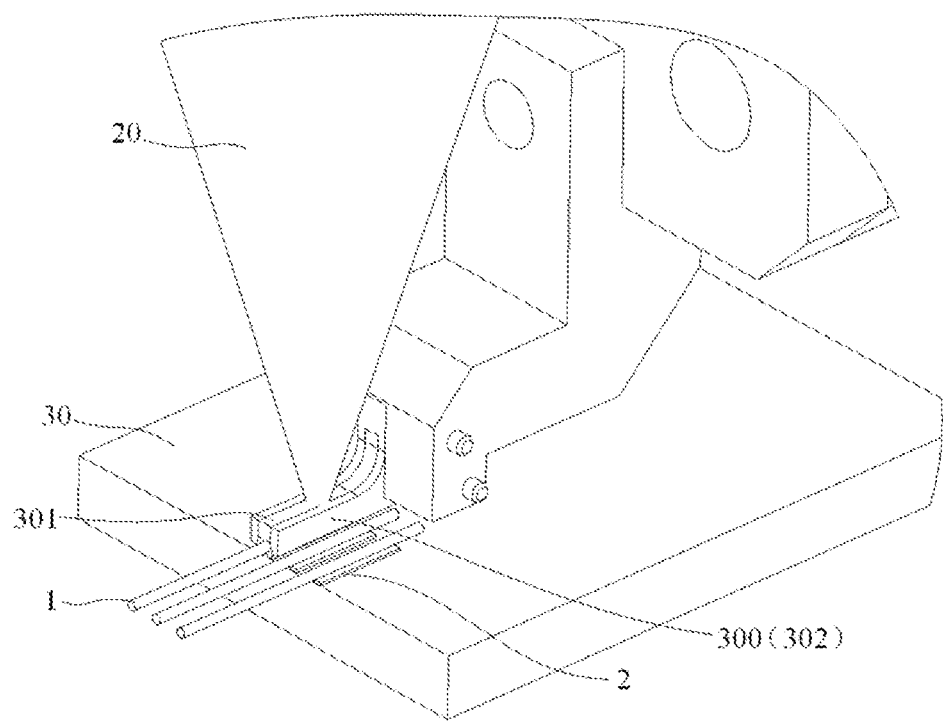
FIG. 5 is an enlarged view of a presser of a laser soldering system according to another embodiment of the invention.

A laser soldering system according to another embodiment of the invention is shown in FIG. 5. The laser soldering system shown in FIG. 5 is different from the laser soldering system shown in FIG. 1 only in the configuration of the presser 100, and consequently, only a presser 300 of the embodiment of FIG. 5 will be described herein.

As shown in FIG. 5, the presser 300 forms a slot between opposite sidewalls 302, and a transparent member 301 is disposed in the slot. The object 1 is also positioned within the slot between the opposite sidewalls 302, and the transparent member 301 directly contacts the top of the object 1 to press the object 1 against the product 30. The sidewalls 302 are made of thermal insulation material, so as to prevent heat from being transferred between adjacent target locations 2 and disadvantageously affecting the soldering flux 32 at the adjacent target location 2.

Figure 6:
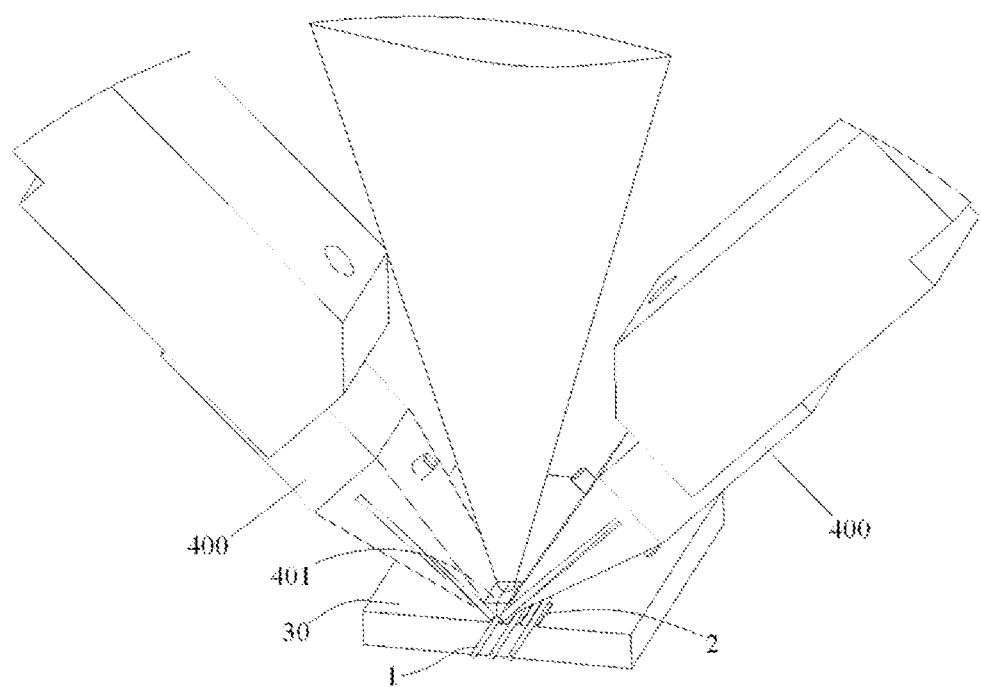
FIG. 6 is an enlarged view of a gripper of a laser soldering system according to another embodiment of the invention.

A laser soldering system according to another embodiment of the invention is shown in FIG. 6. The laser soldering system shown in FIG. 6 omits the presser 100 of the laser soldering system shown in FIG. 1.

As shown in FIG. 6, a gripper 400 is integrated with a transparent member 401. After the gripper 400 grips the object 1 and places the object 1 accurately on the target location 2 under the guidance of the vision system, the transparent member 401 directly presses on the top of the accurately positioned object 1 to hold the object 1 on the target location 2. A laser beam from the laser 20 transmits through the transparent member 401 and heats the soldering flux 32. Since the transparent member 401 is integrated on the gripper 400, the structure of the laser soldering system is simplified.

Advantageously, according to the laser soldering system of the present invention, soldering on a complicated product 30 can be automatically performed under the control of the moving system 10. Compared with manually soldering the complicated product, the laser soldering system greatly increases the efficiency and precision of soldering. Furthermore, the laser soldering system tightly and reliably presses an object 1 on a target location 2 during soldering, preventing improperly formed solder joints from occurring on the product 30.

What is claimed is:

1. A laser soldering system, comprising:
    a moving system having a robot arm with multiple degrees of freedom;
    a gripper mounted on the robot arm, the gripper gripping an object and placing the object at a target location on a product to be soldered, the gripper defining two opposing surfaces oriented parallel with one another and extending in a longitudinal direction for gripping two opposite sides of the object therebetween;
    a presser mounted on the robot arm and having an elastic transparent member formed from a single material, the elastic transparent member fixedly attached to the presser and arranged within a slot defined between two separate and opposing sidewalls of the presser and extending downwardly below the two separate and opposing sidewalls for directly contacting a top surface of the object and pressing the object against the product, the two separate and opposing sidewalls extending upwardly above the elastic transparent member and defining an open end of the slot, the elastic transparent member directly fixedly attached to the two separate and opposing sidewalls of the slot, the slot extending in the longitudinal direction transverse to a pressing direction of the presser and generally parallel with a longitudinal axis of the object, the gripper being moveable independently of the presser; and
    a laser having an end arranged within the open end of the slot and adjacent the elastic transparent member, the laser emitting a laser beam through the elastic transparent member to solder the object to the target location while the object is pressed against the product.

2. The laser soldering system of claim 1, wherein the laser heats a soldering flux on the product for soldering the object to the product.

3. The laser soldering system of claim 2, wherein the soldering flux is a conductive paste pre-printed on the product, an alloy solder pre-melted or fused on the product, or a welding wire applied to the product during soldering.

4. The laser soldering system of claim 2, wherein the object is a wire, the product is a circuit board, and the target location is a pad on the circuit board, and wherein the soldering flux joins the wire to the pad on the circuit board.

5. The laser soldering system of claim 4, wherein gripper positions the wire such that a center line of the wire is aligned with a center line of the pad.

6. The laser soldering system of claim 4, wherein the elastic transparent member protrudes from the presser and has an arc recess surface.

7. The laser soldering system of claim 6, wherein the arc recess surface directly presses on a top surface of the wire.

8. The laser soldering system of claim 4, wherein the wire is arranged on the pad before being gripped by the gripper.

9. The laser soldering system of claim 1, wherein the gripper and the presser are removably mounted to the installation plate.

10. The laser soldering system of claim 1, wherein the gripper automatically places the object at the target location, the presser automatically presses the object against the product, and the laser automatically solders the object to the target location.

11. The laser soldering system of claim 1, wherein the moving system has an installation plate disposed on an end of the robot arm.

12. The laser soldering system of claim 7, wherein the elastic transparent member comprises a body extending in the longitudinal direction generally parallel with the longitudinal axis of the wire, wherein the arc recess extends along the body in the longitudinal direction.

13. The laser soldering system of claim 12, wherein a portion of the body of the elastic transparent member protruding from the presser tapers between the presser and the arc recess.

14. The laser soldering system of claim 1, wherein an end of the laser extends only partially into the slot and aligns with the elastic transparent member.

15. The laser soldering system of claim 1, wherein the laser heats a solder material for joining the object to the product.

16. A laser soldering system, comprising:
    a moving system having a robot arm with multiple degrees of freedom;
    a gripper mounted on the robot arm, the gripper gripping an object and placing the object at a target location on a product to be soldered, the gripper defining two opposing surfaces oriented parallel with one another and extending in a longitudinal direction for gripping two opposite sides of the object therebetween;
    a presser mounted on the robot arm and having an elastic transparent member formed from a single material and arranged in a slot defined between two separate and opposing sidewalls of the presser, the elastic transparent member directly fixedly attached to the two separate and opposing sidewalls of the presser and extending downwardly below the two separate and opposing sidewalls for directly contacting a top surface of the object and pressing the object against the product, the two separate and opposing sidewalls extending upwardly above the elastic transparent member and defining an open end of the slot, the gripper being moveable independently of the presser; and
    a laser having an end arranged within the open end of the slot and directly adjacent to the elastic transparent member, the laser emitting a laser beam through the elastic transparent member to solder the object to the target location while the object is pressed against the product.

17. A laser soldering system, comprising:
    a moving system having a robot arm with multiple degrees of freedom;
    a gripper mounted on the robot arm, the gripper defining two opposing surfaces for gripping two opposite sides of an object therebetween and placing the object at a target location on a product to be soldered;
    a presser mounted on the robot arm, the presser defining a longitudinal slot between two separate and opposing sidewalls thereof;
    an elastic transparent member arranged within the longitudinal slot between the two separate and opposing sidewalls of the presser and configured to directly contact a top surface of the object and press the object against the product, the two separate and opposing sidewalls extending upwardly above the elastic transparent member and defining an open end of the slot, the elastic transparent member including:
        a body formed from a single material and protruding downwardly from the longitudinal slot and below the two separate and opposing sidewalls of the presser, the body extending in the longitudinal direction of the slot, the slot defining an open lateral end exposing a longitudinal end of the elastic transparent member, the exposed end of the elastic transparent member aligned with the open end of the slot; and
        an arc recess surface defined on an end of the body for engaging with the object, the arc recess surface extending in the longitudinal direction of the slot and generally parallel with a longitudinal axis of the object and transverse to a pressing direction of the presser, wherein the opposing surfaces of the gripper are oriented parallel with the longitudinal axis of the object; and
    a laser having an end arranged within the open end of the slot and adjacent the elastic transparent member, the laser emitting a laser beam through the elastic transparent member to solder the object to the target location while the object is pressed against the product.

18. The laser soldering system of claim 17, wherein the gripper is moveable independently of the presser.

19. The laser soldering system of claim 17, wherein:
    the laser extends partially through the slot and aligns with the elastic transparent member.

20. The laser soldering system of claim 19, wherein the slot defines a constant width.

21. The laser soldering system of claim 1, wherein the slot defines a constant width.

22. The laser soldering system of claim 1, wherein an open lateral end of the slot exposes an end of the elastic transparent member.

23. The laser soldering system of claim 22, wherein the exposed end of the elastic transparent member is aligned with the open lateral end of the slot.

\* \* \* \* \*